United States Patent
Nakashiba et al.

(10) Patent No.: US 7,295,938 B2
(45) Date of Patent: Nov. 13, 2007

(54) CLOCK JITTER CALCULATION DEVICE, CLOCK JITTER CALCULATION METHOD, AND CLOCK JITTER CALCULATION PROGRAM

(75) Inventors: Takafumi Nakashiba, Kyoto (JP); Takahiro Ochi, Kyoto (JP); Mitsuko Takada, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/392,538

(22) Filed: Mar. 30, 2006

(65) Prior Publication Data

US 2006/0220751 A1    Oct. 5, 2006

(30) Foreign Application Priority Data

Mar. 30, 2005   (JP) ............................. 2005-098512

(51) Int. Cl.
*G01K 13/00* (2006.01)

(52) U.S. Cl. ............................. 702/69; 702/67; 702/79; 324/76.77; 324/76.13

(58) Field of Classification Search .................. 702/67, 702/69, 79; 327/77, 156, 158; 324/613, 324/622, 612, 76.77, 76.13; 375/224–227, 375/354, 355
See application file for complete search history.

(56) References Cited

U.S. PATENT DOCUMENTS

| | | | |
|---|---|---|---|
| 5,557,196 A * | 9/1996 | Ujiie .................... 324/76.77 |
| 6,339,553 B1 * | 1/2002 | Kuge .......................... 365/194 |
| 6,651,016 B1 * | 11/2003 | Shaw et al. .................... 702/69 |
| 6,701,269 B1 * | 3/2004 | Jungerman et al. ......... 702/106 |
| 6,795,496 B1 * | 9/2004 | Soma et al. ................. 375/226 |
| 6,934,648 B2 * | 8/2005 | Hanai et al. ................... 702/69 |
| 7,002,358 B2 * | 2/2006 | Wyatt .......................... 324/622 |
| 7,123,589 B1 * | 10/2006 | Dawes et al. ................ 370/248 |
| 2003/0125888 A1 * | 7/2003 | Yamaguchi et al. ........... 702/69 |
| 2003/0156673 A1 * | 8/2003 | Yanai .......................... 375/371 |
| 2004/0062301 A1 * | 4/2004 | Yamaguchi et al. ........ 375/226 |
| 2005/0069031 A1 * | 3/2005 | Sunter et al. ................ 375/224 |
| 2005/0081171 A1 | 4/2005 | Kawano et al. |
| 2005/0152488 A1 * | 7/2005 | Buckwalter et al. ......... 375/350 |
| 2005/0163204 A1 * | 7/2005 | Brewer ........................ 375/224 |
| 2006/0047450 A1 * | 3/2006 | Tabatabaei et al. ............ 702/69 |
| 2006/0187109 A1 * | 8/2006 | Suzuki ......................... 341/170 |

FOREIGN PATENT DOCUMENTS

JP    10-321725 A    12/1998

* cited by examiner

*Primary Examiner*—Carol S. W. Tsai
(74) *Attorney, Agent, or Firm*—McDermott Will & Emery LLP

(57) ABSTRACT

In a voltage drop analysis step S101, the process calculates a temporal variation of a power source voltage supplied to each cell along a transmission path of a clock signal. In a delay variation rate ratio calculation step S102, the process calculates a delay time variation of each cell according to the power source voltage variation. In a clock delay variation amount calculation step S103, the process obtains the magnitude of jitter of the clock signal based on the delay time variation.

12 Claims, 6 Drawing Sheets

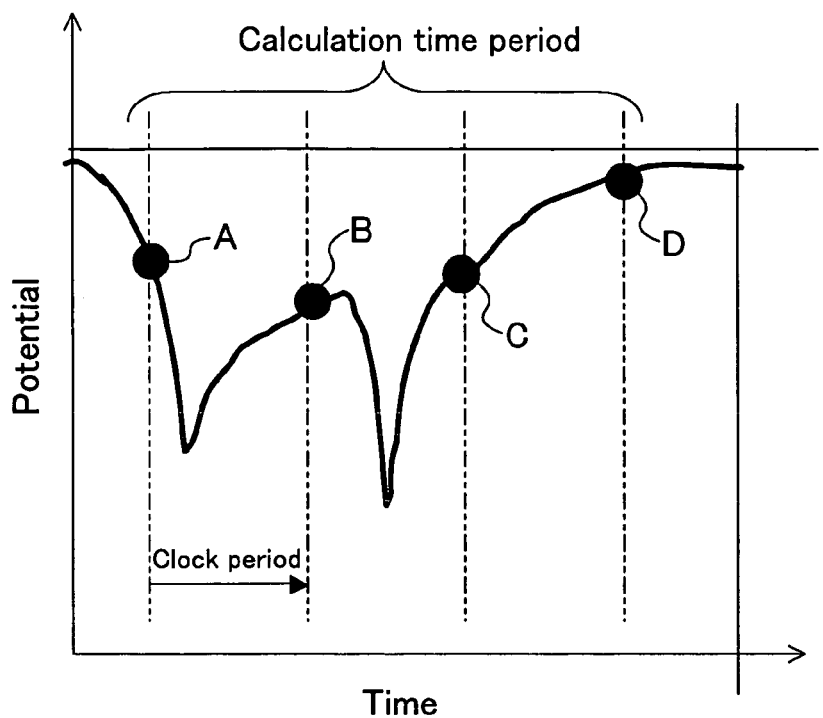

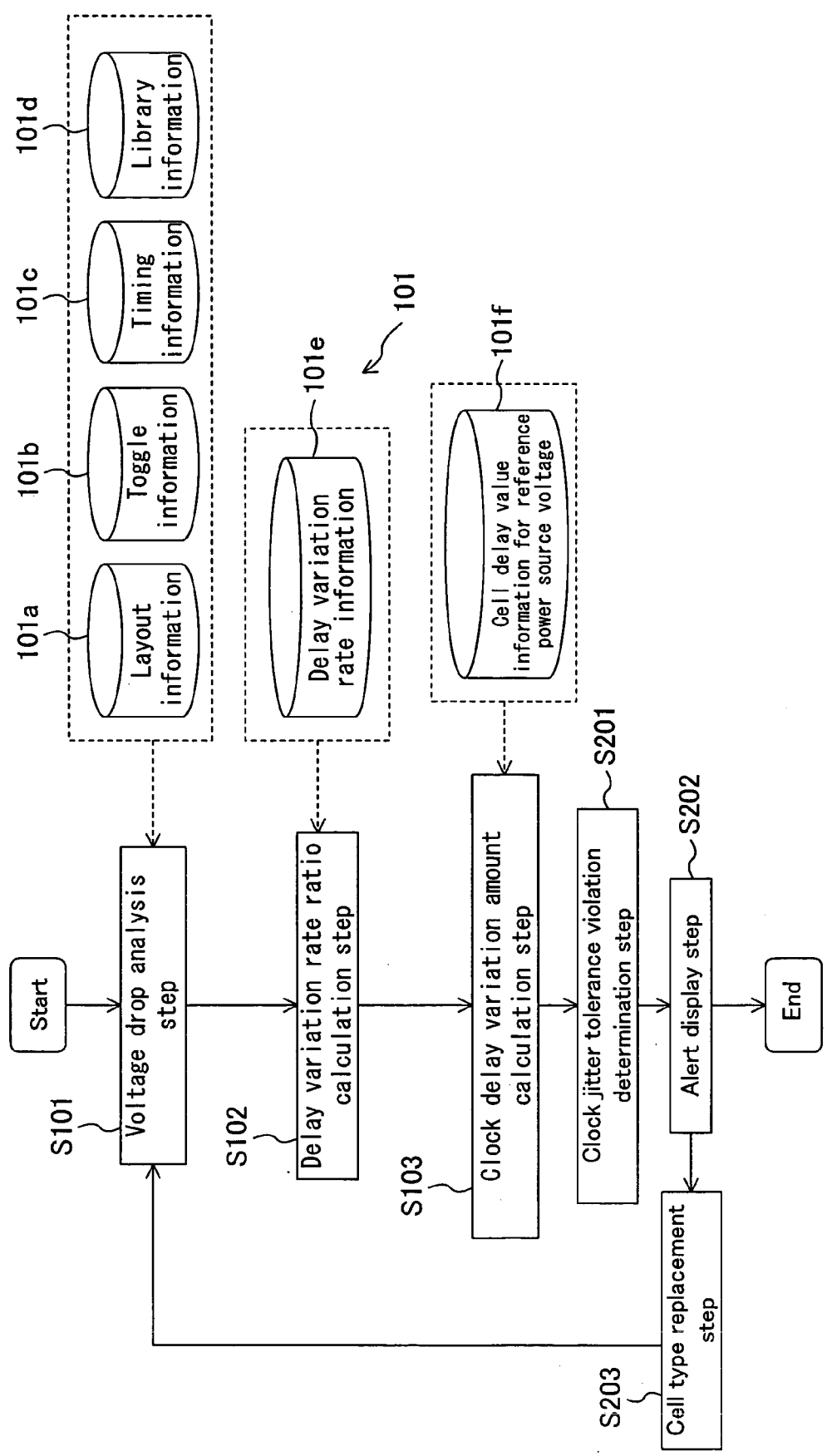

FIG.6

Violating location information

| Instance name | Drive capability | Cell delay (ps) | Jitter amount(ps) |
|---|---|---|---|
| clk1(Clock source) | — | — | — |
| clk1_inst1(BUF) | X1 | 850 | 33 |
| clk1_inst2(BUF) | X2 | 300 | 22 |
| clk1_inst3(BUF) | X3 | 200 | 23 |
| FF_inst1/CK(Clock) | — | — | 46 |

CLOCK JITTER CALCULATION DEVICE, CLOCK JITTER CALCULATION METHOD, AND CLOCK JITTER CALCULATION PROGRAM

BACKGROUND OF THE INVENTION

1. Field of the Invention

The present invention relates to a clock jitter calculation device for calculating the magnitude of clock jitter in a semiconductor integrated circuit caused by power source noise, or the like, with which it is possible to, for example, perform timing analysis and timing verification with clock jitter taken into consideration.

2. Description of the Background Art

With finer process rules, the influence from the physical phenomena, such as crosstalk, electromigration, hot-carrier degradation, and power source voltage drop (IR drop), has become pronounced, affecting the operation of semiconductor integrated circuits. The power source voltage drop, among others, has become particularly pronounced as the process rules become finer. This is a phenomenon that occurs due to the resistance of the power source line in a circuit, and is influenced by simultaneous switching of a plurality of circuits. A significant voltage drop decreases the operation speed of the circuit, and may lead to an erroneous operation of the circuit.

Conventionally, countermeasures have been taken, such as performing timing verification with a design margin taken into account, and reinforcing the power source line based on a reduction in the clock transmission delay and/or based on empirical rules. However, these countermeasures increase the chip area and the power consumption due to excessive designing, in addition to increasing the man-hour for design. In view of this, Japanese Laid-Open Patent Publication No. 10-321725, for example, proposes a timing verification method using a cell library storing the cell delay time for each supply voltage. In this method, the lowest supply voltage of each cell is estimated based on the switching information of the cell, and the delay time of the cell is obtained according to the estimated lowest supply voltage of the cell. Then, timing verification is performed based on the delay time of each cell thus obtained.

However, with the timing verification method in which the delay time is determined according to the lowest supply voltage as described above, it is not possible to perform the analysis for circuits for which jitter guarantees are required (e.g., fast IF (interface) circuits and AD (analog/digital) converters). Moreover, for some paths of which timing is analyzed (extending from the start point of analysis to the end point of analysis), there is often obtained an analysis result with a timing margin or a verification result with no timing margin.

However, recent system LSIs, for example, which have an increased degree of integration, an increased speed and a decreased operating voltage, are more significantly influenced by jitter of a clock signal being transmitted. Therefore, the conventional method, in which the influence of jitter of a clock signal being transmitted cannot be taken into consideration, tends to produce less reliable verification results. Thus, there is an increased possibility that an actual device will operate erroneously even if timing verification indicates a normal operation. In worst cases, the device may need to be re-designed, thus imposing a significant risk.

These problems mentioned above become even more pronounced when the process rule rapidly becomes finer or when the functionality of a system LSI is increased. Thus, in order to improve the performance and the reliability of a chip, it is important to accurately determine, control and reduce the magnitude of clock jitter.

SUMMARY OF THE INVENTION

It is therefore an object of the present invention to calculate the magnitude of clock jitter caused by power source noise, or the like, thereby making it possible to easily perform timing verification with high reliability.

In order to achieve the object set forth above, a first device as an example of the present invention is a clock jitter calculation device for calculating a magnitude of jitter of a clock signal based on information representing a circuit configuration, including:

a supply voltage analysis section for calculating a variation over a predetermined period of time in a supply voltage of a power source supplied to each cell along a transmission path of the clock signal;

a delay time variation calculation section for calculating a variation in delay time of each cell according to the supply voltage variation; and a jitter calculation section for calculating the magnitude of jitter of the clock signal transmitted via the transmission path based on the delay time variation.

A second device as an example of the present invention is based on the first clock jitter calculation device, wherein the supply voltage analysis section calculates the supply voltage for each period of the clock signal.

A third device as an example of the present invention is based on the first clock jitter calculation device, wherein the supply voltage analysis section obtains an amount of voltage drop caused by a current flowing through each cell and calculates the supply voltage, which is lower than a predetermined reference supply voltage by the voltage drop amount.

A fourth device as an example of the present invention is based on the first clock jitter calculation device, wherein the delay time variation calculation section calculates the delay time variation based on a relationship between the supply voltage and a value corresponding to the delay time for each cell, and the supply voltage calculated by the supply voltage analysis section.

A fifth device as an example of the present invention is based on the fourth clock jitter calculation device, wherein the delay time variation calculation section calculates the delay time variation by using a table storing values each representing a supply voltage to each cell and values each corresponding to a delay time, in which the supply voltage values are associated with the values each corresponding to the delay time.

A sixth device as an example of the present invention is based on the fourth clock jitter calculation device, wherein the delay time variation calculation section calculates the delay time variation by an approximate expression for obtaining a value corresponding to the delay time using a value representing the supply voltage to each cell as a parameter.

A seventh device as an example of the present invention is based on the fourth clock jitter calculation device, wherein the value corresponding to the delay time is a ratio of the delay time when a predetermined supply voltage is supplied with respect to the delay time when a predetermined reference supply voltage is supplied.

An eighth device as an example of the present invention is based on the first clock jitter calculation device, wherein the supply voltage analysis section calculates, as the supply voltage variation, lowest and highest supply voltages being first and second supply voltages or lowest and average supply voltages being first and second supply voltages.

A ninth device as an example of the present invention is based on the eighth clock jitter calculation device, wherein the delay time variation calculation section obtains, as the delay time variation, a value obtained by subtracting 1 from a ratio of the delay time corresponding to the first supply voltage with respect to the delay time corresponding to the second supply voltage, and multiplying the subtraction result with the delay time when a predetermined reference supply voltage is supplied.

A tenth device as an example of the present invention is based on the eighth clock jitter calculation device, wherein the delay time variation calculation section obtains, as the delay time variation, a difference between the delay time corresponding to the first supply voltage and the delay time corresponding to the second supply voltage.

An eleventh device as an example of the present invention is based on the first clock jitter calculation device, wherein the jitter calculation section calculates the magnitude of jitter by obtaining a root-sum-square value of delay time variations for all cells, which are calculated by the delay time variation calculation section.

A twelfth device as an example of the present invention is based on the first clock jitter calculation device, wherein the jitter calculation section calculates the magnitude of jitter by obtaining a total sum value of delay time variations for all cells, which are calculated by the delay time variation calculation section.

With these devices of the present invention, it is possible to obtain the delay time variation according to the supply voltage variation, and to obtain the magnitude of jitter of the clock signal. Thus, it is possible to easily predict the magnitude of clock jitter, thereby easily eliminating the risk that an actual device may operate erroneously.

A thirteenth device as an example of the present invention is based on the first clock jitter calculation device, further including a clock jitter tolerance violation determination section for determining whether or not the calculated magnitude of jitter is within a predetermined tolerable range.

A fourteenth device as an example of the present invention is based on the thirteenth clock jitter calculation device, further including an alert display section, wherein if it is determined by the clock jitter tolerance violation determination section that the calculated magnitude of jitter is outside the tolerable range, the alert display section displays an alert indicating the transmission path of the clock signal.

A fifteenth device as an example of the present invention is based on the thirteenth clock jitter calculation device, further including a cell replacement section, wherein if it is determined by the clock jitter tolerance violation determination section that the calculated magnitude of jitter is outside the tolerable range, the cell replacement section produces information representing a new circuit configuration in which a cell along the transmission path of the clock signal is replaced with another cell, wherein the clock jitter calculation device calculates a magnitude of jitter for the new circuit configuration.

With these devices, a clock jitter tolerance violation is notified through the alert display, or the like, whereby it is possible to easily identify the cause of a defect in the output from the layout operation. Alternatively, it is possible to easily estimate, without performing the layout operation again, the clock jitter amount after the cell type replacement, etc.

A sixteenth device as an example of the present invention is based on the first clock jitter calculation device, further including:

a delay time calculation section for calculating a maximum delay time corresponding to a lowest supply voltage and a minimum delay time corresponding to a highest supply voltage in transmission paths of various signals including the clock signal; and a timing analysis section for determining whether or not a timing constraint is satisfied based on the maximum or minimum delay time obtained by the delay time calculation section and the magnitude of jitter of the clock signal obtained by the jitter calculation section.

Thus, it is possible to perform timing verification with high reliability.

BRIEF DESCRIPTION OF THE DRAWINGS

FIG. 3 is a graph showing variations in the supply voltage.

FIG. 4 shows an example of delay variation rate information 101e.

FIG. 5 is a functional block diagram showing functional blocks of a clock jitter calculation device according to Embodiment 2 of the present invention.

FIG. 6 shows an example of violating location information.

DETAILED DESCRIPTION OF THE PREFERRED EMBODIMENTS

Figure 1:
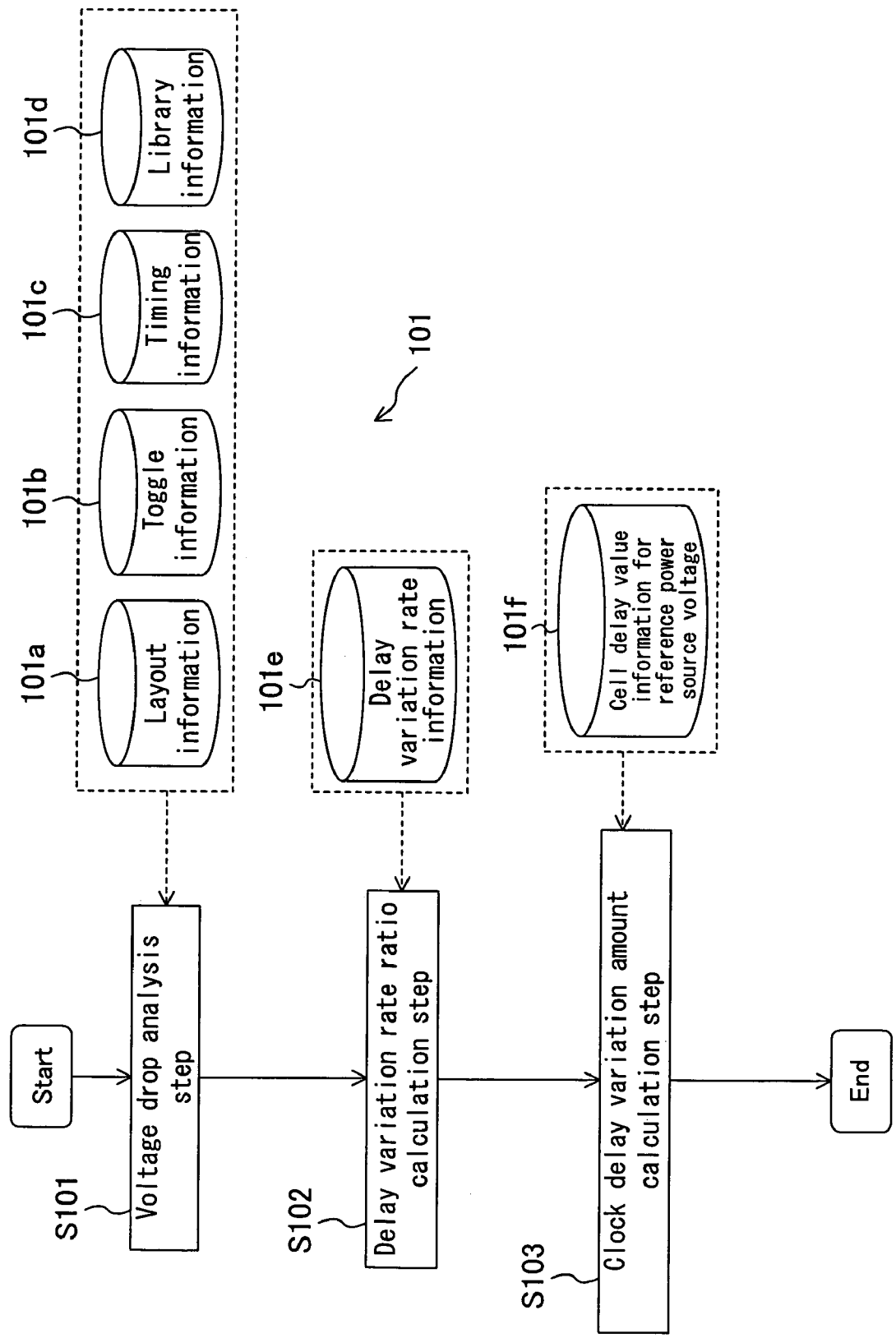
FIG. 1 is a functional block diagram showing functional blocks of a clock jitter calculation device according to Embodiment 1 of the present invention.

Preferred embodiments of the present invention will now be described with reference to the drawings. Note that in each of the following embodiments, like elements to those of any preceding embodiments will be denoted by like reference numerals, and will not be described repeatedly.

Embodiment 1

FIG. 1 shows a clock jitter calculation device according to Embodiment 1 of the present invention. The clock jitter calculation device may be a computer, for example, including a CPU, a memory, a storage device, an I/O device, etc., with software provided therein. Functionally, the device may be formed by various sections functioning to perform the various steps shown in FIG. 1, for example.

In a voltage drop analysis step S101, the device obtains variations in the AC (alternating current)-wise voltage drop amount for each cell of the circuit being designed based on information stored in a storage device 101, and calculates the temporal change of the supply voltage being supplied as the power source voltage to the cell over a predetermined calculation time period, i.e., the supply voltage values at a plurality of points in time within the time period, based on which the lowest supply voltage and the highest supply voltage are obtained. Instead of using the lowest and highest supply voltages, the lowest and average supply voltages may be used.

Figure 2:
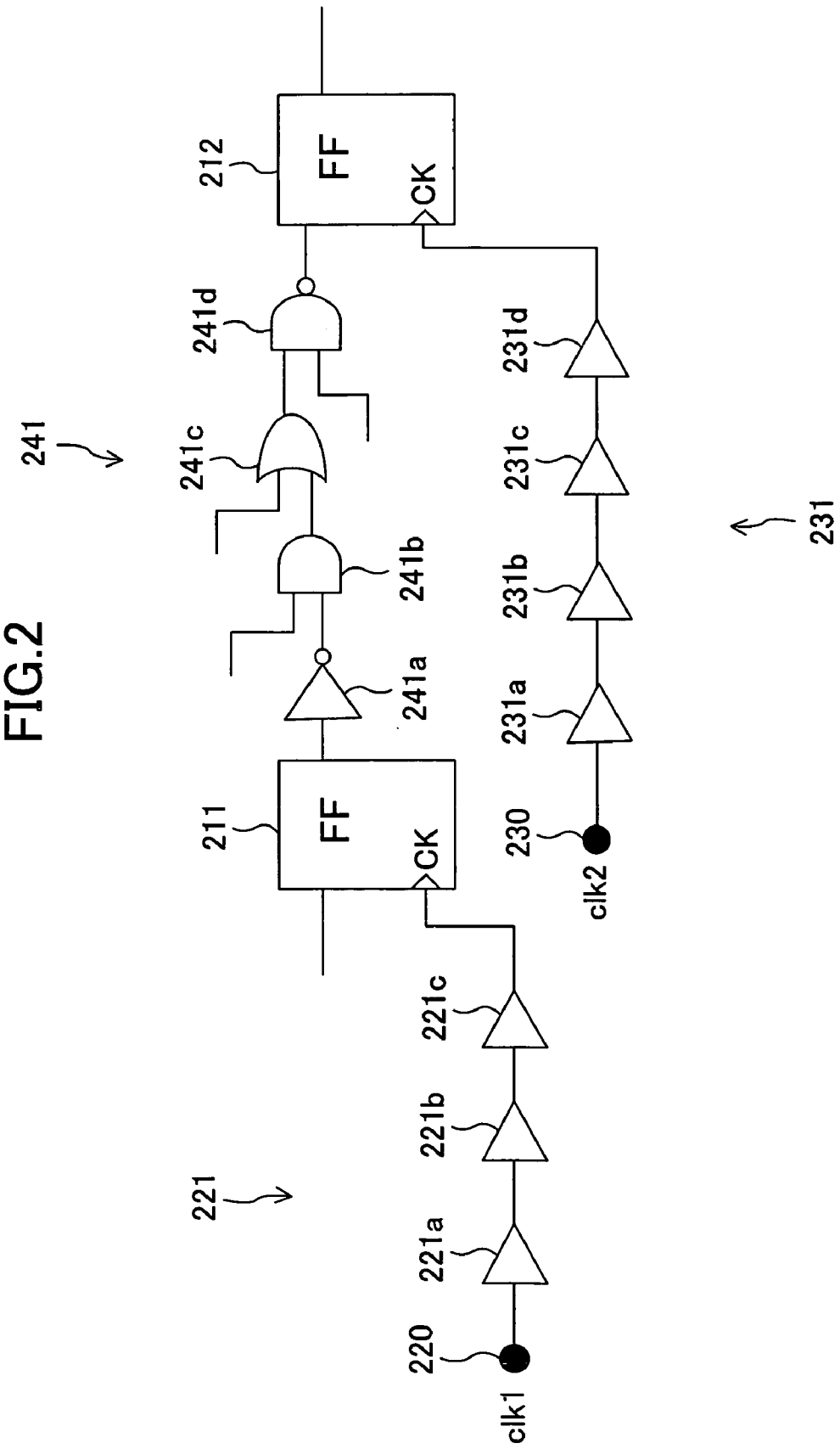
FIG. 2 is a circuit diagram showing an example of a circuit being designed whose clock jitter is calculated.

Specifically, the storage device 101 stores therein various pieces of information, including layout information 101a, toggle information 101b, timing information 101c, and library information 101d. The layout information 101a includes information representing the arrangement of and connections between various elements (cells) on the chip of the circuit being designed as shown in FIG. 2, information representing the power source line topology and the power source line width, etc. The toggle information 101b represents the toggle rate for each net connected to a cell, indicating the rate at which the signal potential of the net transitions from high to low or from low to high. The timing information 101c represents the frequency of each clock, the switching timing of each cell, which clock is used to control the cell, etc. The library information 101d includes information for obtaining the current consumption of each cell, i.e., the current consumption information, which is defined as a function between the input signal transition time and the output signal load capacitance for each combination of a cell type and an input signal, etc.

FIG. 3 shows an example of how the cell potential (supply voltage) changes over a timing window (calculation time period) extending over three reference periods, based on which the voltage drop amount is analyzed. In FIG. 3, characters A to D each denote a potential at a switching of the cell. In a case where there are more than one clock signals, the reference periods are preferably based on a dominant clock signal.

The voltage drop amount may be obtained continuously (strictly speaking, at minute intervals) as shown by a solid line in FIG. 3, or may be obtained at longer intervals, e.g., at the points in time A to D. In view of the fact that it is the voltage variation at a switching of a cell that significantly influences the signal delay time, it may be sufficient just to obtain the supplied power source voltage at such timing, i.e., at each switching of a cell and/or at times when switching is likely to occur.

Specifically, the voltage drop amount can be easily obtained by, for example, dynamic analysis using any of various tools known in the art, etc., or it may alternatively be obtained through circuit operation simulation, or the like.

The example of a circuit being designed shown in FIG. 2 will now be described briefly. In this circuit, signals are transmitted between flip-flops 211 and 212 via a cell group 241 including combined cells 241a to 241d. The flip-flops 211 and 212 are driven by clock signals clk1 and clk2 supplied from clock source points 220 and 230 via a cell group 221 including combined cells 221a to 221c and a cell group 231 including combined cells 231a to 231d, respectively.

In a delay variation rate ratio calculation step S102, the device obtains the delay variation rate of each cell for different operating voltages (delay variation rate information 101e), as shown in FIG. 4, for example. Specifically, based on information representing the relationship between each of various supply voltages to a representative cell (to be described later) and the delay variation rate (i.e., the ratio of the delay time for the supply voltage to that for a predetermined reference voltage), and based on the lowest and highest supply voltages to the cell obtained in the voltage drop analysis step S101, the device obtains the delay variation rate for the lowest supply voltage and that for the highest supply voltage, and calculates the delay variation rate ratio of the cell by Expression 1 below.

Delay variation rate ratio of each cell=delay variation rate for lowest supply voltage/delay variation rate for highest supply voltage      Expression 1

More specifically, the delay variation rate information 101e may be a table containing, for each of various supply voltages, the ratio between the delay time for a predetermined reference power source voltage (e.g., 1.20 V) and the delay time for the supply voltage. Such a table is provided for each process used for forming a semiconductor element, and represents the delay characteristics of a representative cell, which are either simulated or actually measured while varying the power source voltage. The representative cell is preferably a cell that is frequently used in a semiconductor integrated circuit and that exhibits, for varied power source voltages, a simulated or actually-measured delay variation of an average level among all cells.

Instead of using such a table, a function of the supply voltage may be used. Specifically, the delay variation rate may be obtained by using an approximate expression such as a polynominal expression with the supply voltage being a parameter.

Since the delay variation rate ratio of each cell is equal to the ratio of the delay time itself, the device may first obtain the delay time for the lowest supply voltage and that for the highest supply voltage, and then obtain the ratio therebetween. In such a case, instead of using the relationship between the supply voltage and the delay variation rate for a representative cell as described above, the device may use the relationship between the supply voltage and the delay time for each cell. (However, in view of the fact that there are normally many cells that have different delay times for the reference power source voltage but are similar in terms of the delay variation rate, the relationship between the supply voltage and the delay variation rate for a representative cell may be relied upon to easily reduce the amount of information of the delay variation rate information 101e.)

After the delay variation rate ratio is calculated for all the cells, the process proceeds to a clock delay variation amount calculation step S103. In this step, based on the cell delay value information 101f for the reference power source voltage representing the delay time (delay value) of each cell for the reference power source voltage and the delay variation rate ratio for each cell obtained in the delay variation rate ratio calculation step S102, the device calculates by Expressions 2 and 3 below the delay variation amount of each cell and the delay variation amount at the end of the transmission path of each clock signal, i.e., the magnitude of clock jitter (clock delay variation amount).

Delay variation amount of each cell=cell delay value of each cell for reference power source voltage×(delay variation rate ratio of each cell−1)      Expression 2

Delay variation amount along transmission path of each clock signal=$\sqrt{(\Sigma(\text{delay variation amount of each cell})^2)}$      Expression 3

Instead of using Expression 3, Expression 4 below may be used which simply obtains the total sum of the delay variation amounts of the cells.

Delay variation amount along transmission path of each clock signal=Σ(delay variation amount of each cell)      Expression 4

Alternatively, the delay variation amount of each cell may be the difference between the delay time of the cell for the lowest supply voltage and that for the highest supply voltage, and the root-sum-square value or the total sum value thereof may be obtained, as long as the delay variations of the cells along the clock signal transmission path are combined together.

Cells along the clock signal transmission path are extracted by performing a search in the input direction (opposite to the clock signal transmission direction) starting from the clock pin (input terminal) of the cell (the flip-flops 211 and 212) until reaching the clock source (the clock source points 220 and 230). Specifically, for the clock signal input to the clock signal input terminal CK of the flip-flop 211, for example, the cells 221c, 221b and 221a are selected (extracted) in this order.

A specific example of how the magnitude of clock jitter is calculated through steps described above for the circuit being designed shown in FIG. 2 will now be described.

For example, assume that the highest and lowest supply voltages supplied to the cell 221a are calculated in the voltage drop analysis step S101 to be 1.18 V and 1.15 V, respectively. Then, in the delay variation rate ratio calculation step S102, the delay variation rates for the highest and lowest supply voltages are determined to be 1.03 and 1.07, respectively, referring to the delay variation rate information 101e (FIG. 4). (When no information is stored for the exact supply voltage as in the case of FIG. 4, the corresponding delay variation rate can be calculated by linear interpolation, or the like.) In the clock delay variation amount calculation step S103, the delay variation rate ratio is calculated by Expression 1 to be 1.039.

Similarly, assuming that the highest and lowest supply voltages of the cell 221b are 1.19 V and 1.14 V, respectively, the delay variation rate ratio of the cell 221b is 1.074.

Similarly, assuming that the highest and lowest supply voltages of the cell 221c are 1.19 V and 1.12 V, respectively, the delay variation rate ratio of the cell 221c is 1.113.

For example, where the cells 221a to 221c have delay times for the reference power source voltage (e.g., 1.20 V) (cell delay values for the reference power source voltage) of 850 ps, 300 ps and 200 ps, respectively, the delay variation amount along the clock signal transmission path is calculated by Expressions 2 and 3 to be 46 ps.

As described above, for each cell present along the clock signal transmission path, the device obtains the magnitude of clock jitter, which is the delay time variations due to AC-wise power source voltage variations, i.e., supply voltage variations, thereby making it possible to easily perform timing verification with high reliability.

Embodiment 2

FIG. 5 shows a clock jitter calculation device according to Embodiment 2 of the present invention, which is formed by sections functioning to further perform a clock jitter tolerance violation determination step S201, an alert display step S202 and a cell type replacement step S203, in addition to those performed by the device of Embodiment 1. The device calculates the magnitude of clock jitter (the delay variation amount of the clock signal along the transmission path thereof) as in Embodiment 1, and automatically makes changes to the circuit being designed according to the magnitude of clock jitter.

In the clock jitter tolerance violation determination step S201, the magnitude of clock jitter calculated as described above is compared with a predetermined tolerance value to determine whether or not the magnitude of clock jitter is within the tolerable range.

In the alert display step S202, an alert is displayed if it is determined that the magnitude of clock jitter is outside the tolerable range.

Moreover, if it is determined that the magnitude of clock jitter is outside the tolerable range, in the cell type replacement step S203, a change, or the like, is made to the layout information 101a of the circuit being designed such that a cell included in the clock signal transmission path where the clock jitter occurs is replaced with another cell having a different drive capability. The magnitude of clock jitter is repeatedly recalculated in a similar manner for the circuit being designed to which such a change has been made.

Specifically, if the clock jitter tolerance value is set to be 50 ps where the magnitude of clock jitter is calculated to be 46 ps in the clock delay variation amount calculation step S103 as in Embodiment 1, for example, the process is exited without performing the alert display step S202 according to the determination made in the clock jitter tolerance violation determination step S201. However, where the clock jitter tolerance value is set to be 40 ps, the magnitude of clock jitter is determined to be outside the tolerable range in the clock jitter tolerance violation determination step S201, whereby the device displays a predetermined alert in the alert display step S202, and displays information about violating locations in the circuit being designed where the magnitude of clock jitter is outside the tolerable range, as shown in FIG. 6, for example. The example of FIG. 6 shows that the cell denoted by the instance name clk1_inst1 has a large jitter amount (the delay variation amount calculated by Expression 2 above). In the instance name column of FIG. 6, the designation "(BUF)" represents a type of the cell, and the designation "X1" in the drive capability column indicates that the cell is of the type with the lowest drive capability (higher suffix numbers indicate higher drive capability).

In the cell type replacement step S203, the drive capability of each cell along the clock signal transmission path is changed, or the cell is replaced with another cell of an equivalent logic that operates faster with the same supply voltage, while checking whether or not the magnitude of clock jitter with the new cell falls within the clock jitter tolerance value.

For example, where the cell whose instance name is clk1_inst1 is replaced with a cell of another cell type (e.g., a cell having a drive capability of X2), recalculation is performed for the delay information of the new cell, and what is referred to as the layout information of the cell data in the voltage drop analysis step S101, etc., is changed, after which the series of steps are performed again, thus calculating the magnitude of jitter of each clock signal after the cell replacement. Such an operation is repeated until the magnitude of clock jitter falls within the tolerable range.

Embodiment 3

Figure 7:
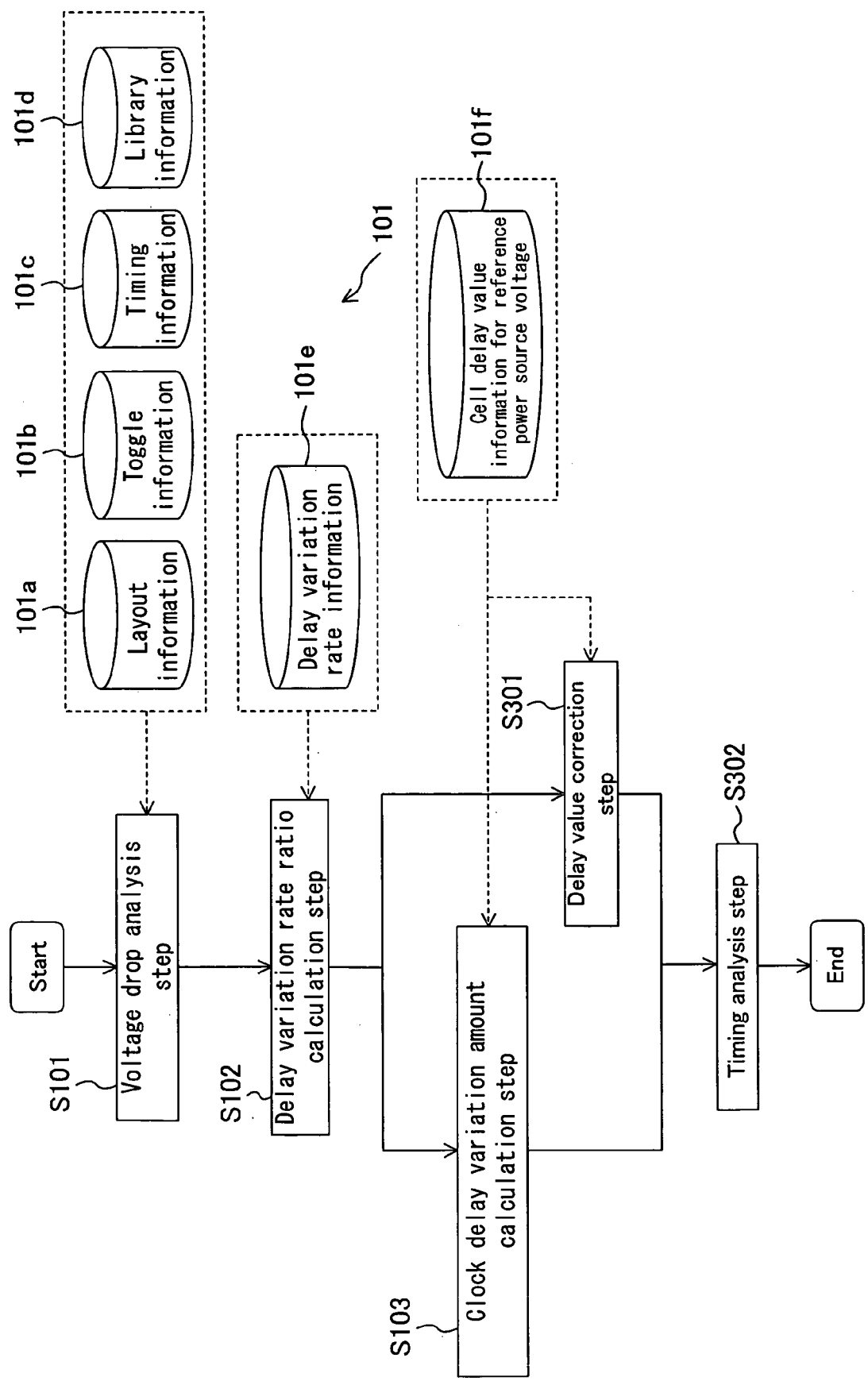
FIG. 7 is a functional block diagram showing functional blocks of a clock jitter calculation device according to Embodiment 3 of the present invention.

FIG. 7 shows a clock jitter calculation device according to Embodiment 3 of the present invention, which is formed by sections functioning to further perform a delay value correction step S301 and a timing analysis step S302, in addition to those performed by the device of Embodiment 1. The device calculates the magnitude of clock jitter (the delay variation amount of the clock signal along the transmission path thereof) as in Embodiment 1, and performs timing analysis for the circuit being designed based on the magnitude of clock jitter.

In the delay value correction step S301, the device calculates, for all the cells of the circuit being designed, the corrected cell delay time (maximum delay time) taking into consideration an increase in delay due to a decrease in the power source voltage as shown in Expression 5 below, based on the delay variation rate for the lowest supply voltage obtained when calculating the delay variation rate ratio of a cell in the delay variation rate ratio calculation step S102 as described in Embodiment 1 and the cell delay value information 101f for the reference power source voltage (the cell delay value of each cell for the reference power source voltage).

Corrected cell delay time=cell delay value of each
cell for reference power source voltage×delay
variation rate for lowest supply voltage    Expression 5

In the timing analysis step S302, the device performs timing analysis by performing timing verification for verifying whether various timing constraints are satisfied, based on the corrected cell delay time calculated in the delay value correction step S301 and the magnitude of clock jitter calculated in the clock delay variation amount calculation step S103 as described above in Embodiment 1.

A specific example of how the magnitude of clock jitter is calculated through steps described above and how timing analysis is performed for the circuit being designed shown in FIG. 2 is calculated will now be described.

In the voltage drop analysis step S101, the delay variation rate ratio calculation step S102 and the clock delay variation amount calculation step S103, the magnitude of clock jitter is calculated to be 46 ps for the cell group 221 transmitting the clock signal clk1 as in Embodiment 1, for example.

Similarly, for the cell group 231 transmitting the clock signal clk2:

the delay variation rate ratio of the cell 231a is 1.039 where the highest supply voltage is 1.18 V and the lowest supply voltage is 1.15 V;

the delay variation rate ratio of the cell 231b is 1.015 where the highest supply voltage is 1.19 V and the lowest supply voltage is 1.18 V;

the delay variation rate ratio of the cell 231c is 1.113 where the highest supply voltage is 1.19 V and the lowest supply voltage is 1.12 V; and the delay variation rate ratio of the cell 231d is 1.074 where the highest supply voltage is 1.19 V and the lowest supply voltage is 1.14 V.

For example, where the cells 231a to 231d have delay times for the reference power source voltage (e.g., 1.20 V) of 300 ps, 500 ps, 200 ps and 350 ps, respectively, the delay variation amount along the clock signal transmission path, i.e., the magnitude of clock jitter, is calculated by Expressions 2 and 3 to be 37 ps.

In the delay value correction step S301, the corrected cell delay time is obtained for all the cells of the circuit being designed.

Specifically, the corrected cell delay time of the cell group 221 is calculated to be 910 ps, 327 ps and 226 ps for the cells 221a to 221c, respectively, and thus the total time is 1463 ps.

Similarly, the corrected cell delay time of the cell group 231 is calculated to be 321 ps, 515 ps, 226 ps and 382 ps for the cells 231a to 231d, respectively, and thus the total time is 1444 ps.

The corrected cell delay time values for the cells of the cell group 241 are as follows:

381.5 ps for the flip-flop 211 where the lowest supply voltage is 1.14 V and the cell delay is 350 ps;

395.5 ps for the cell 241a where the lowest supply voltage is 1.12 V and the cell delay is 350 ps;

381.5 ps for the cell 241b where the lowest supply voltage is 1.14 V and the cell delay is 350 ps;

395.5 ps for the cell 241c where the lowest supply voltage is 1.12 V and the cell delay is 350 ps; and 414 ps for the cell 241d where the lowest supply voltage is 1.14 V and the cell delay is 380 ps.

Thus, the path delay from the flip-flop 211 to the flip-flop 212 is 1968 ps, including an increase of 188 ps due to the influence of the voltage drop.

In the timing analysis step S302, the device performs timing analysis based on the magnitude of clock jitter obtained in the clock delay variation amount calculation step S103, etc., and the corrected cell delay time obtained in the delay value correction step S301. Then, the magnitude of clock jitter is taken into consideration as being variables of the clock signal, i.e., variations in the rise or fall of the clock signal.

For example, in the circuit of FIG. 2, the propagation delay through the cell group 221, i.e., from the clock source point 220 to the clock signal input terminal CK of the flip-flop 211, is 1463 ps as described above, and that from the clock source point 230 to the clock signal input terminal CK of the flip-flop 212 is 1444 ps. For example, assume that half of the magnitude of clock jitter accounts for the variations in the rise of the clock signal or the variations in the fall of the clock signal. Then, the variation of the clock signal clk1 is ±23 ps, and the variation of the clock signal clk2 is ±18.5 ps. Note that the period of the clock signals clk1 and clk2 is 2000 ps. Moreover, for the sake of simplicity, the setup time and the hold time of the flip-flops, the line delay time, etc., are ignored. Then, the setup constraint cannot be satisfied unless the path delay from the flip-flop 211 to the flip-flop 212 is 1939.5 ps (1444-1463+2000-18.5-23 ps) or less. However, the path delay from the flip-flop 211 to the flip-flop 212 is 1968 ps, thus violating the setup constraint.

If the clock jitter is not taken into consideration, the setup constraint is satisfied if the path delay from the flip-flop 211 to the flip-flop 212 is 1981 ps (1444-1463+2000 ps) or less. Since the path delay from the flip-flop 211 to the flip-flop 212 is 1968 ps, there is no setup constraint violation if the clock jitter is not taken into consideration.

Thus, by taking into consideration the possibility that the setup constraint value may deteriorate by about 41.5 ps due to the influence of clock jitter, it is possible to detect a setup constraint violation even in such a case that would otherwise be determined not to violate the setup constraint without taking clock jitter into consideration.

While the above example is directed to a case where it is determined whether or not the setup constraint as a timing constraint is satisfied, the present invention is also applicable to cases where it is determined whether or not the hold constraint, for example, is satisfied. In such a case, the minimum delay time for the highest supply voltage can be used as the corrected cell delay time.

As described above, according to the present invention, the corrected cell delay time for the lowest or highest supply voltage and the magnitude of clock jitter for the lowest and highest supply voltages are obtained, based on which timing analysis or verification is performed. Therefore, it is possible to perform delay calculation while taking into consideration not only the voltage drop for each cell in the circuit but also the clock jitter, whereby it is possible to perform timing analysis with higher reliability.

As described above, according to the present invention, it is possible to calculate the magnitude of clock jitter caused by power source noise, or the like, thereby making it possible to easily perform timing verification with high reliability.

What is claimed is:

1. A clock jitter calculation device for calculating a magnitude of jitter of a clock signal based on information representing a circuit configuration, comprising:

a supply voltage analysis section for calculating a variation over a predetermined period of time in a supply voltage of a power source supplied to each cell along a transmission path of the clock signal;

a delay time variation calculation section for calculating a variation in delay time of each cell according to the supply voltage variation; and a jitter calculation section for calculating the magnitude of jitter of the clock signal transmitted via the transmission path based on the delay time variation, wherein said clock jitter calculation device outputs said calculated magnitude of jitter of the clock signal, and wherein the supply voltage analysis section obtains an amount of voltage drop caused by a current flowing through each cell and calculates the supply voltage, which is lower than a predetermined reference supply voltage by the voltage drop amount.

2. A clock jitter calculation device for calculating a magnitude of jitter of a clock signal based on information representing a circuit configuration, comprising:

a supply voltage analysis section for calculating a variation over a predetermined period of time in a supply voltage of a power source supplied to each cell along a transmission path of the clock signal;

a delay time variation calculation section for calculating a variation in delay time of each cell according to the supply voltage variation; and a jitter calculation section for calculating the magnitude of jitter of the clock signal transmitted via the transmission path based on the delay time variation, wherein said clock jitter calculation device outputs said calculated magnitude of jitter of the clock signal, and wherein the delay time variation calculation section calculates the delay time variation based on a relationship between the supply voltage and a value corresponding to the delay time for each cell, and the supply voltage calculated by the supply voltage analysis section.

3. The clock jitter calculation device of claim 2, wherein the delay time variation calculation section calculates the delay time variation by using a table storing values each representing a supply voltage to each cell and values each corresponding to a delay time, in which the supply voltage values are associated with the values each corresponding to the delay time.

4. The clock jitter calculation device of claim 2, wherein the delay time variation calculation section calculates the delay time variation by an approximate expression for obtaining a value corresponding to the delay time using a value representing the supply voltage to each cell as a parameter.

5. The clock jitter calculation device of claim 2, wherein the value corresponding to the delay time is a ratio of the delay time when a predetermined supply voltage is supplied with respect to the delay time when a predetermined reference supply voltage is supplied.

6. A clock jitter calculation device for calculating a magnitude of jitter of a clock signal based on information representing a circuit configuration, comprising:

a supply voltage analysis section for calculating a variation over a predetermined period of time in a supply voltage of a power source supplied to each cell along a transmission path of the clock signal;

a delay time variation calculation section for calculating a variation in delay time of each cell according to the supply voltage variation; and a jitter calculation section for calculating the magnitude of jitter of the clock signal transmitted via the transmission path based on the delay time variation, wherein said clock jitter calculation device outputs said calculated magnitude of jitter of the clock signal, and wherein the supply voltage analysis section calculates, as the supply voltage variation, lowest and highest supply voltages being first and second supply voltages or lowest and average supply voltages being first and second supply voltages.

7. The clock jitter calculation device of claim 6, wherein the delay time variation calculation section obtains, as the delay time variation, a value obtained by subtracting 1 from a ratio of the delay time corresponding to the first supply voltage with respect to the delay time corresponding to the second supply voltage, and multiplying the subtraction result with the delay time when a predetermined reference supply voltage is supplied.

8. The clock jitter calculation device of claim 6, wherein the delay time variation calculation section obtains, as the delay time variation, a difference between the delay time corresponding to the first supply voltage and the delay time corresponding to the second supply voltage.

9. A clock jitter calculation device for calculating a magnitude of jitter of a clock signal based on information representing a circuit configuration, comprising:

a supply voltage analysis section for calculating a variation over a predetermined period of time in a supply voltage of a power source supplied to each cell along a transmission path of the clock signal;

a delay time variation calculation section for calculating a variation in delay time of each cell according to the supply voltage variation; and a jitter calculation section for calculating the magnitude of utter of the clock signal transmitted via the transmission path based on the delay time variation, wherein said clock jitter calculation device outputs said calculated magnitude of jitter of the clock signal, and wherein the jitter calculation section calculates the magnitude of jitter by obtaining a total sum value of delay time variations for all cells, which are calculated by the delay time variation calculation section.

10. A clock jitter calculation device for calculating a magnitude of jitter of a clock signal based on information representing a circuit configuration, comprising:

a supply voltage analysis section for calculating a variation over a predetermined period of time in a supply voltage of a power source supplied to each cell along a transmission path of the clock signal;

a delay time variation calculation section for calculating a variation in delay time of each cell according to the supply voltage variation;

a jitter calculation section for calculating the magnitude of jitter of the clock signal transmitted via the transmission path based on the delay time variation;

a clock jitter tolerance violation determination section for determining whether or not the calculated magnitude of jitter is within a predetermined tolerable range; and an alert display section, wherein if it is determined by the clock jitter tolerance violation determination section that the calculated magnitude of jitter is outside the tolerable range, the alert display section displays an alert indicating the transmission path of the clock signal, and wherein said clock jitter calculation device outputs said calculated magnitude of jitter of the clock signal.

11. A clock jitter calculation device for calculating a magnitude of jitter of a clock signal based on information representing a circuit configuration, comprising:

a supply voltage analysis section for calculating a variation over a predetermined period of time in a supply voltage of a power source supplied to each cell along a transmission path of the clock signal;

a delay time variation calculation section for calculating a variation in delay time of each cell according to the supply voltage variation;

a jitter calculation section for calculating the magnitude of jitter of the clock signal transmitted via the transmission path based on the delay time variation, a clock jitter tolerance violation determination section for determining whether or not the calculated magnitude of jitter is within a predetermined tolerable range; and a cell replacement section, wherein if it is determined by the clock jitter tolerance violation determination section that the calculated magnitude of jitter is outside the tolerable range, the cell replacement section produces information representing a new circuit configuration in which a cell along the transmission path of the clock signal is replaced with another cell, wherein the clock jitter calculation device calculates a magnitude of jitter for the new circuit configuration, and wherein said clock jitter calculation device outputs said calculated magnitude of jitter of the clock signal.

12. A clock jitter calculation device for calculating a magnitude of jitter of a clock signal based on information representing a circuit configuration, comprising:

a supply voltage analysis section for calculating a variation over a predetermined period of time in a supply voltage of a power source supplied to each cell along a transmission path of the clock signal;

a delay time variation calculation section for calculating a variation in delay time of each cell according to the supply voltage variation; and a jitter calculation section for calculating the magnitude of jitter of the clock signal transmitted via the transmission path based on the delay time variation, a delay time calculation section for calculating a maximum delay time corresponding to a lowest supply voltage and a minimum delay time corresponding to a highest supply voltage in transmission paths of various signals including the clock signal; and a timing analysis section for determining whether or not a timing constraint is satisfied based on the maximum or minimum delay time obtained by the delay time calculation section and the magnitude of jitter of the clock signal obtained by the jitter calculation section, wherein said clock jitter calculation device outputs said calculated magnitude of jitter of the clock signal.

* * * * *